United States Patent [19]
Page et al.

[11] Patent Number: 5,231,560
[45] Date of Patent: Jul. 27, 1993

[54] AUTO-INSERTABLE COMPONENT

[75] Inventors: Jimmy M. Page, Woodville; Bobby R. Fanning, Huntsville, both of Ala.

[73] Assignee: Universal Data Systems, Inc., Huntsville, Ala.

[21] Appl. No.: 843,882

[22] Filed: Feb. 28, 1992

[51] Int. Cl.⁵ ............................................. H05K 7/02
[52] U.S. Cl. .................... 361/400; 248/231.9; 361/417; 361/419; 361/427; 439/68; 439/380
[58] Field of Search ............... 361/396, 399, 400, 405, 361/417, 419, 420, 422, 427; 439/68, 56, 58, 71, 72, 78, 329, 380, 650, 651, 915, 929; 248/220.2, 231.9

[56] References Cited
U.S. PATENT DOCUMENTS

| | | | |
|---|---|---|---|
| 3,284,671 | 11/1966 | Batier et al. | 361/396 |
| 3,588,618 | 6/1971 | Otte | 361/419 |
| 4,727,656 | 2/1988 | Mehta et al. | 361/420 |
| 4,751,612 | 6/1988 | Smith | 174/138 D |

Primary Examiner—Gregory D. Thompson
Attorney, Agent, or Firm—Wayne J. Egan

[57] ABSTRACT

An auto-insertable component (200) may be soldered to a printed circuit board by an assembly line robot. The auto-insertable component includes a bracket (203) with at least one component (201), such as a speaker, affixed thereto. The component is coupled to terminals (211, 221), which are affixed to the bracket and arranged for soldering (215, 225) to a printed circuit board (205).

18 Claims, 3 Drawing Sheets

AUTO-INSERTABLE COMPONENT

FIELD OF THE INVENTION

This application relates to components including, but not limited to, auto-insertable components.

BACKGROUND OF THE INVENTION

In printed circuit board (sometimes abbreviated as "PCB") manufacturing and assembly, it is desirable to have components that may be attached to the printed circuit board by automatic insertion machines or robots.

Referring to FIG. 1, there is shown a typical component used for printed circuit board assembly, as in the prior art. There is shown a bracket 103, with a component 101 affixed thereto, with mounting standoffs 111 and 121. The component has a first lead 113 and a second lead 123. There is also shown a printed circuit board 105 with a first bonding pad 117 and a second bonding pad 127. As shown, after the bracket is affixed to the printed circuit board 105, it is then necessary to solder the first lead 113 to the first bonding pad 117 at point 115, and the second lead 123 to the second bonding pad 127 at point 125.

One problem with this arrangement is, of course, that it is difficult for a assembly line robot to solder the leads 113, 123 to the bonding pads 117, 127.

SUMMARY OF THE INVENTION

As a result, there is disclosed an auto-insertable component comprising:

a bracket including at least one component affixed thereto;

a plurality of terminals affixed to the bracket and arranged for soldering to a printed circuit board, the plurality of terminals including at least a first terminal and a second terminal;

the at least one component including at least a first lead coupled to the first terminal and a second lead coupled to the second terminal.

By using an auto-insertable component in accordance with the invention, the component may be soldered to a printed circuit board by an assembly line robot.

DETAILED DESCRIPTION

Figure 1:
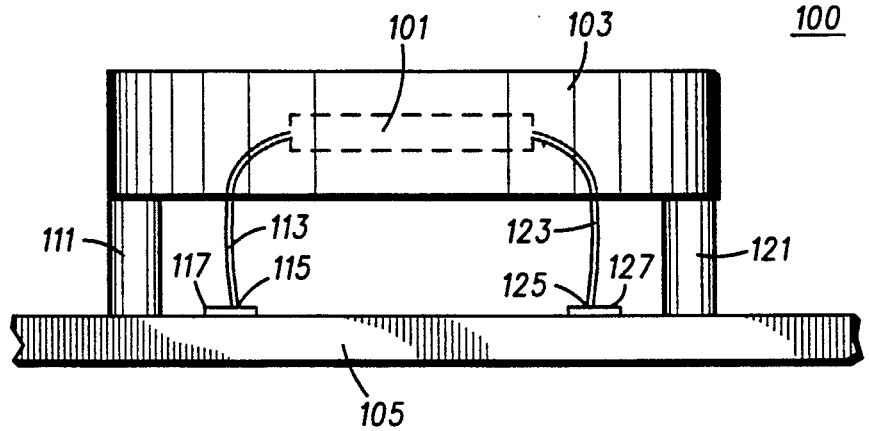
FIG. 1 shows a component, in accordance with the prior art.
Figure 2:
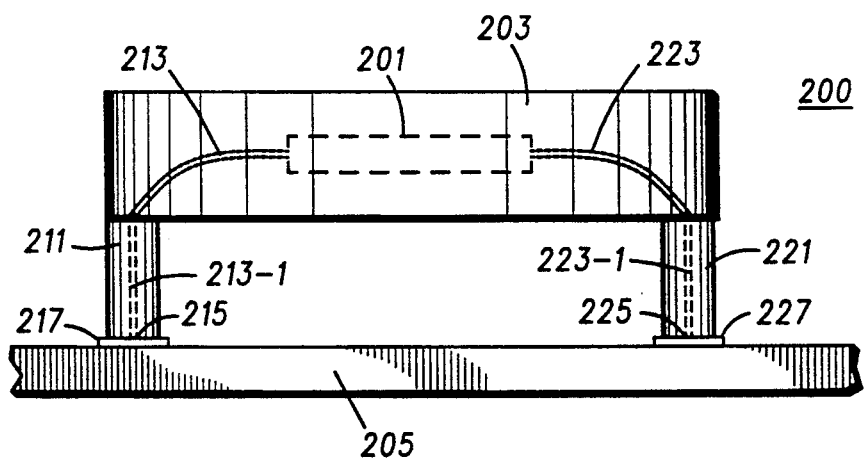
FIG. 2 shows a printed circuit board including a first embodiment of an auto-insertable component, in accordance with the invention.

FIG. 2 shows a printed circuit board 205 including a first embodiment of an auto-insertable component, in accordance with the invention. There is shown a bracket 203 including a component 201. The bracket 203 has affixed thereto at least a first terminal 211 and a second terminal 221 fabricated from a suitable conducting material. The component 201 includes a first lead 213 coupled to the first terminal 211 and a second lead 223 coupled to the second terminal 221. The component 201 may comprise, for example, a speaker.

The auto-insertable component, comprising the bracket 203, terminals 211, 221, component 201, and leads 213, 223, assembled as described above, then may be attached to a printed circuit board 205. As shown, the first terminal 211 is soldered to a first bonding pad 217 at point 215; and the second terminal 221 is soldered to a second bonding pad 227 at point 225, respectively.

A first conducting path is thus established from the component 201 to the first bonding pad 217. This first conducting path consists of the first lead 213, the first terminal 211—the conducting path within the first terminal 211 represented by the broken line 213-1—and the first solder point 215.

Also, a second conducting path is thus established from the component 201 to the second bonding pad 227. This second conducting path consists of the second lead 223, the second terminal 221—the conducting path within the second terminal 221 represented by the broken line 223-1—and the second solder point 225.

Thus, there is depicted in FIG. 2:

A printed circuit board 205 including an auto-insertable component, the auto-insertable component comprising:

a bracket 203 including at least one component 201 affixed thereto;

a plurality of terminals affixed to the bracket and arranged for soldering to the printed circuit board 205 at solder points 215 and 225, the plurality of terminals including at least a first terminal 211 and a second terminal 221; and, the at least one component including at least a first lead 213 coupled to the first terminal and a second lead 223 coupled to the second terminal.

Moreover, the at least one component 201 may include a speaker; and the plurality of terminals may include a third terminal.

Figure 3:
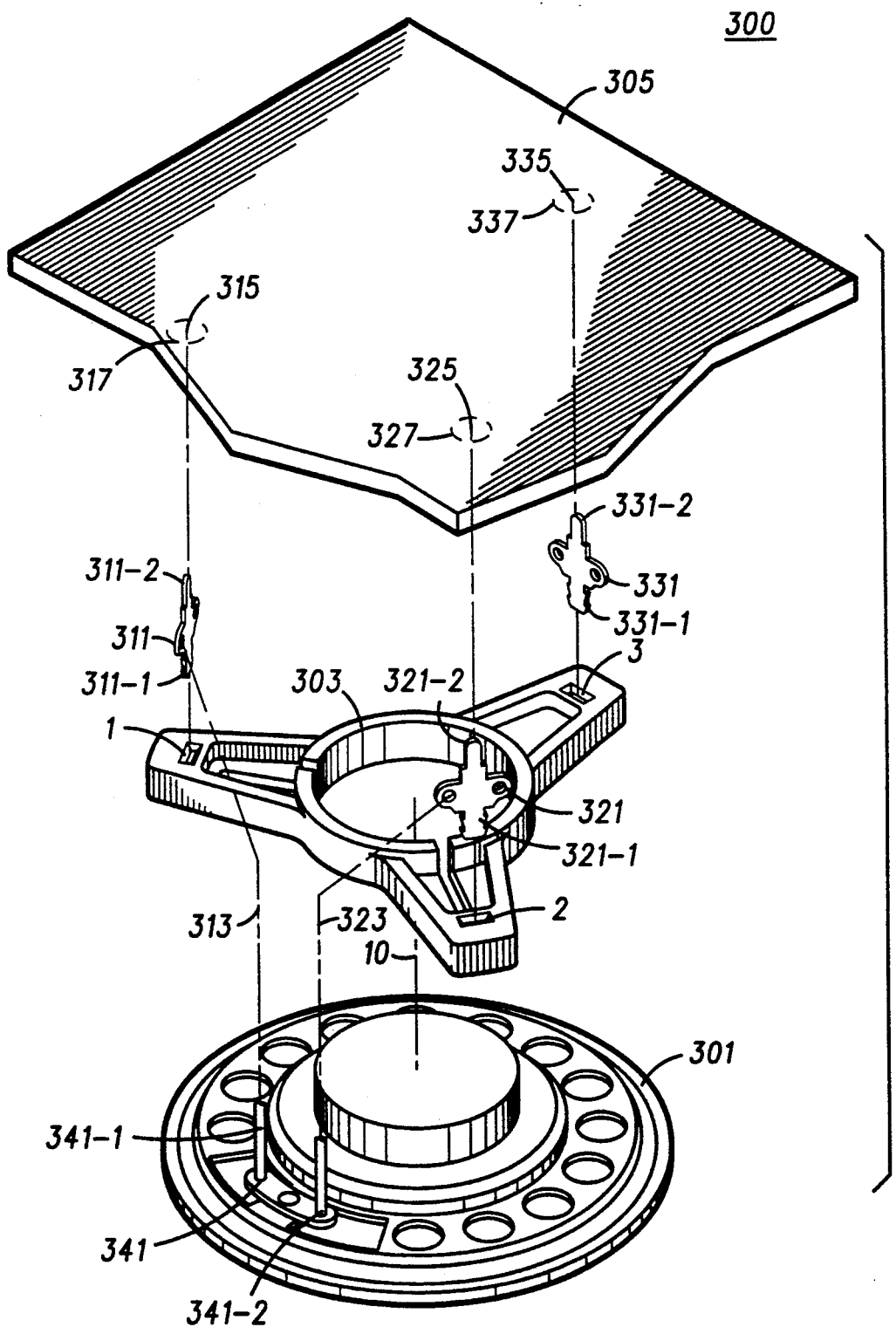
FIG. 3 shows a printed circuit board including a second embodiment of an auto-insertable component, in accordance with the invention.

FIG. 3 shows a printed circuit board 305 including a second embodiment of an auto-insertable component, in accordance with the invention. There is shown a bracket 303 including a speaker 301. The speaker 301 includes a speaker terminal strip 341 with a first terminal 341-1 and a second terminal 341-2. The terminals 341-1 and 341-2, in turn, are connected to the voice coil of speaker 301. While, for purposes of clarity, FIG. 3 depicts the speaker 301 as detached from the bracket 303, those skilled in the art will appreciate that the speaker 301 may be affixed to the bracket 303, as depicted in FIG. 2.

As shown, the bracket 303 includes a first hole designated 1, a second hole designated 2, and a third hole designated 3. There is also depicted a first terminal 311 proximate to the first hole 1, a second terminal 321 proximate to the second hole 2, and a third terminal 331 proximate to the third hole 3. The terminals are fabricated from a suitable conducting material. Referring to the third terminal 331 as representative of the plurality of terminals 311, 321, 331, it is seen terminal 331 includes a first elongated finger, designated 331-1, and a second elongated finger, designated 331-2. Likewise, terminal 311 includes a first elongated finger 311-1 and a second elongated finger 311-2; and terminal 321 includes a first elongated finger 321-1 and a second elongated finger 321-2.

While, for purposes of clarity, FIG. 3 depicts the terminals 311, 321, 331 as detached from their corresponding holes 1, 2, 3, those skilled in the art will appreciate that the first terminal 311 may be affixed to the bracket 303 by mounting the first finger 311-1 thereof within the first hole 1; and that the second terminal 321 may be affixed to the bracket 303 by mounting the first finger 321-1 thereof within the second hole 2; and that the third terminal 331 may be affixed to the bracket 303 by mounting the first finger 331-1 thereof within the third hole 3.

To facilitate the mounting of the terminals 311, 321, 331 in their respective holes 1, 2, 3, each terminal finger 311-1, 321-1, 331-1 may be fabricated with groves or threads, for example.

After affixing the terminals 311, 321, 331 to the bracket 303 by mounting the terminals 311, 321, 331 in the holes 1, 2, 3, respectively, as described above, the first speaker terminal 341-1 may be connected to the first terminal 311 by means of a first lead depicted as 313. Likewise, the second speaker terminal 341-2 may be connected to the second terminal 321 by means of a second lead depicted as 323.

The auto-insertable speaker, comprising the bracket 303, terminals 311, 321, 331, speaker 301, speaker terminal strip 341, and leads 313, 323, assembled as described above, then may be attached to a printed circuit board designated 305. The printed circuit board includes a first, second and third bonding pads designated 317, 327, and 337, respectively. As shown, the first terminal 311 may be affixed to the printed circuit board 305 by soldering the second finger 311-2 thereof to the first bonding pad 317 at point 315. Likewise, the second terminal 321 may be affixed to the printed circuit board 305 by soldering the second finger 321-2 thereof to the second bonding pad 327 at point 325. Likewise, the third terminal 331 may be affixed to the printed circuit board 305 by soldering the second finger 331-2 thereof to the third bonding pad 337 at point 335.

A first conducting path is thus established from the speaker 301 to the first bonding pad 317. This first conducting path consists of the first speaker terminal 341-1, the first lead 313, the first terminal 311, and the first solder point 315. Also, a second conducting path is thus established from the speaker 301 to the second bonding pad 327. This second conducting path consists of the second speaker terminal 341-2, the second lead 323, the second terminal 321, and the second solder point 325.

Thus, there is depicted in FIG. 3:

A printed circuit board 305 including an auto-insertable speaker, the auto-insertable speaker comprising:

a bracket 303 including a speaker 301 affixed thereto, the bracket containing at least a first hole 1, a second hole 2, and a third hole 3;

a first terminal 311, a second terminal 321 and a third terminal 331 affixed to the bracket by mounting in the first hole, second hole, and third hole, respectively;

the first, second, and third terminals arranged for soldering to the printed circuit board 305 at solder points 315, 325, and 335, respectively; and, the speaker having a first lead 313 coupled to the first terminal and a second lead 323 coupled to the second terminal.

Figure 4:
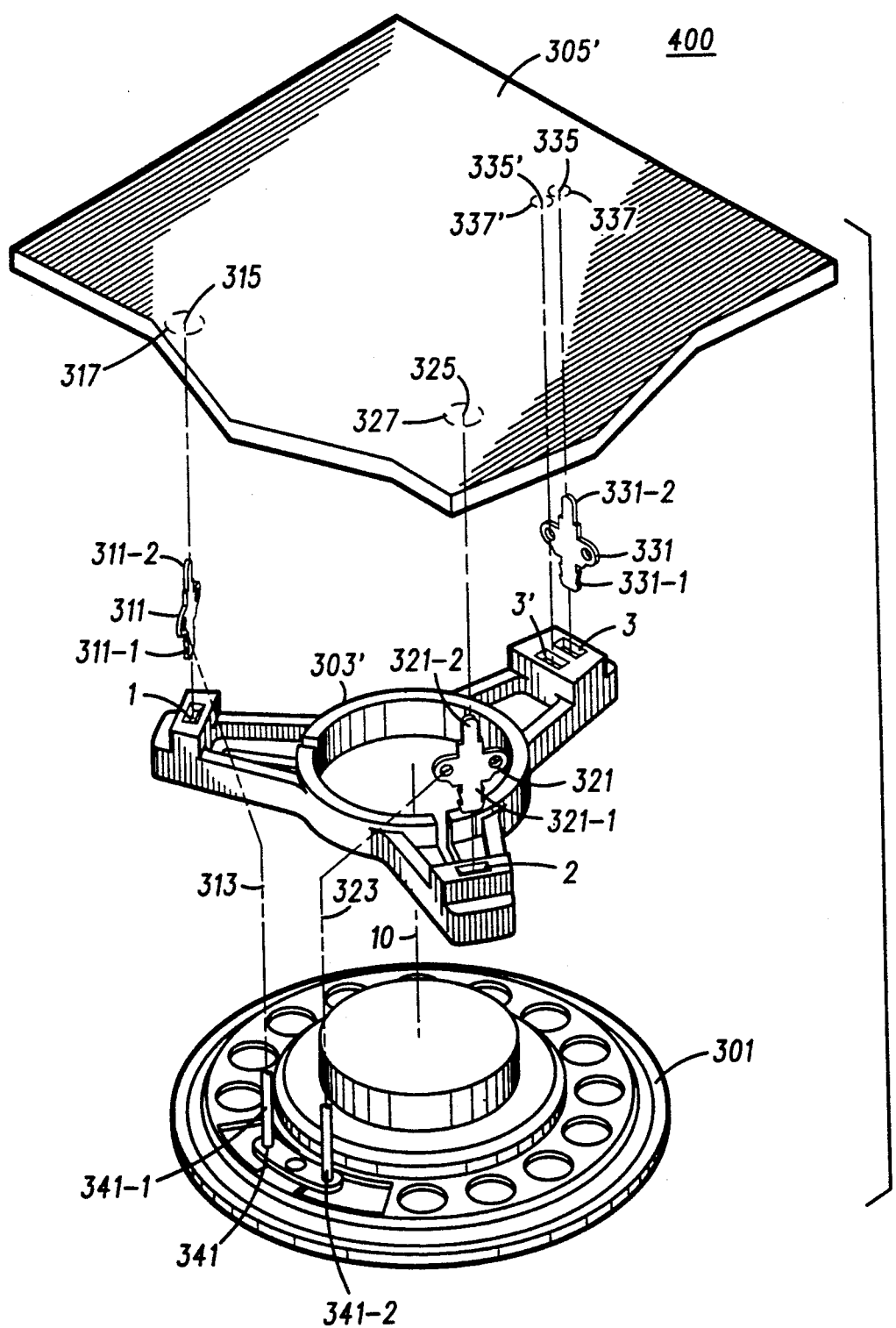
FIG. 4 shows a printed circuit board including a third embodiment of an auto-insertable component, in accordance with the invention.

FIG. 4 shows a printed circuit board 305' including a third embodiment of an auto-insertable component, in accordance with the invention.

There is shown a bracket 303' including the speaker 301 and speaker terminal strip 341 of FIG. 3. As shown, the bracket 303' depicted here in FIG. 4, similar to the bracket 303 of FIG. 3, includes a first hole designated 1, a second hole designated 2, and a third hole designated 3. Unlike the previous bracket 303 of FIG. 3, however, the present bracket 303' also includes a fourth hole designated 3'. The present terminals 311, 321, and 331 are identical to those of FIG. 3. As shown, the first terminal 311 is mounted within the first hole 1, and the second terminal 321 is mounted within the second hole 2, as previously-described above.

In contrast to the previously-described embodiment of FIG. 3, however, the third terminal 331 may be affixed to the bracket 303' either by mounting the third hole 3, or in the fourth hole 3'.

After affixing the terminals 311, 321, 331 to the bracket by mounting terminals 311 and 321 in the holes 1 and 2, respectively, and by mounting terminal 331 in either hole 3 or hole 3', as described above, the first lead 313 may be connected from the speaker terminal 341-1 to the first terminal 311, and the second lead 323 may be coupled from the speaker terminal 341-2 to the second terminal 321, as described above.

The auto-insertable speaker, comprising the bracket 303', terminals 311, 321, 331, speaker 301, speaker terminal strip 341, and leads 313, 323, assembled as described above, then may be attached to a printed circuit board designated 305'.

As shown, the printed circuit board 305' depicted here in FIG. 4, similar to the printed circuit board 303 of FIG. 3, includes a first, second and third bonding pads designated 317, 327, and 337, respectively. Unlike the previous printed circuit board 305 of FIG. 3, however, the present printed circuit board 305' also includes a fourth bonding pad designated 337'.

As shown, the first terminal 311 may be affixed to the printed circuit board 305 by soldering the second finger 311-2 thereof to the first bonding pad 317 at point 315. Likewise, the second terminal 321 may be affixed to the printed circuit board 305 by soldering the second finger 321-2 thereof to the second bonding pad 327 at point 325.

In contrast to the previously-described embodiment of FIG. 3, however, the third terminal 331 may be affixed to the printed circuit board 305 by soldering the second finger 331-2 thereof either to the third bonding pad 337 at point 335, or to the fourth bonding pad 337' at point 335', depending on whether the third terminal 331 is mounted in the third hole 3 or the fourth hole 3', respectively.

As in the previously-described embodiment of FIG. 3, above, a first conducting path is established from the speaker 301 to the first bonding pad 317 via the first speaker terminal 341-1, the first lead 313, the first terminal 311, and the first solder point 315; and a second conducting path is established from the speaker 301 to the second bonding pad 327 via the second speaker terminal 341-2, the second lead 323, the second terminal 321, and the second solder point 325.

As depicted in FIG. 4, the first hole 1, second hole 2, and third hole 3 are equidistant from the center axis line designated 10. Thus, mounting the third terminal 331 in the third hole 3 results in all terminals 311, 321, and 331 being symmetric with respect to the center line 10. Note, however, the fourth hole 3' is positioned a finite distance closer to line 10 than the third hole 3. In a typical auto-insertable speaker application, for example, the inner fourth hole 3' may be located 0.100 inches closer to 10 than the outermost third hole 3. Thus, mounting the third terminal 331 in the inner fourth hole 3', results in the three terminals 311, 321, and 331 being non-symmetric with respect to line 10. The printed circuit board 305' may then be fabricated with the same non-symmetrical bonding pad pattern. This limits the mounted component assembly to only one (1) possible orientations. As a result, the component assembly cannot be assembled onto the PC board incorrectly. This non-symmetrical terminal configuration thus functions as a polarity guard, thus effectively eliminating the chance that the auto-insertable component terminals 311, 321, and 331 may be inadvertently soldered to the incorrect bonding pads on the printed circuit board 305'.

Thus, there is depicted in FIG. 4:

A printed circuit board 305' including an auto-insertable speaker, the auto-insertable speaker comprising:

a bracket 303' including a speaker 301 affixed thereto, the bracket containing a plurality of holes;

a first terminal 311, a second terminal 321 and a third terminal 331 affixed to the bracket by mounting in the plurality of holes, each hole having no more than one terminal mounted therein;

the first, second, and third terminals arranged for soldering to the printed circuit board 305'; and, the speaker having a first lead 313 coupled to the first terminal and a second lead 323 coupled to the second terminal.

Moreover, as depicted, the bracket 303' contains a first hole 1, a second hole 2, a third hole 3, and a fourth hole 3'; the first terminal (311) is mounted in the first hole 1, the second terminal 321 is mounted in the second hole 2, and the third terminal 331 is mounted in either the third hole 3 or the fourth hole 3'.

Figure 5:
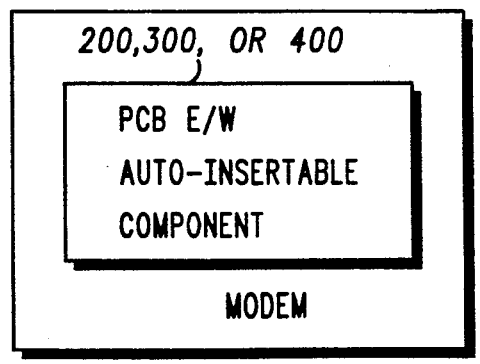
FIG. 5 is a block diagram showing a modem including a printed circuit board having an auto-insertable component, in accordance with the invention.

FIG. 5 is a block diagram showing a modem 500 including a printed circuit board having an auto-insertable component, in accordance with the invention. The auto-insertable component may comprise either the first embodiment 200, as depicted in FIG. 2, or the second embodiment 300, as depicted in FIG. 3, or the third embodiment 400, as depicted in FIG. 4.

One advantage of an auto-insertable component, in accordance with the present invention, is that it allows components—such as a speaker—to be fully integrated into a modern high-volume automated assembly line. Thus, the auto-insertable component, in accordance with the present invention, may be removed from a shipping carton by a robot and placed onto a printed circuit board, which is on a conveyor belt. The conveyor belt passes the printed circuit board over a solder wave where the component is soldered to the printed circuit board. The solder thus serves to electrically connect the component to the printed circuit board and also mechanically hold it in place. No further labor is involved, yielding a totally automated assembly.

By taking full advantage of the teachings of the present invention, therefore, substantial cost savings in labor and material are possible. Moreover, the total number of opportunities for error in an automated production line may be significantly reduced, thus substantially increasing product quality and yield.

While various embodiments of an auto-insertable component, according to the present invention, have been described hereinabove, the scope of the invention is defined by the following claims.

What is claimed is:

1. An auto-insertable component comprising:
   a bracket including at least one component affixed thereto;
   a plurality of terminals affixed to the bracket and arranged for soldering to a printed circuit board, the plurality of terminals including at least a first terminal and a second terminal;
   the at least one component including at least a first lead coupled to the first terminal and a second lead coupled to the second terminal;
   the at least one component including a speaker.

2. The auto-insertable component of claim 1, the plurality of terminals including a third terminal.

3. In combination:
   a bracket including a speaker affixed thereto;
   a first terminal, a second terminal and a third terminal affixed to the bracket and arranged for soldering to a printed circuit board; and,
   the speaker having a first lead coupled to the first terminal and a second lead coupled to the second terminal.

4. A printed circuit board including an auto-insertable component, the auto-insertable component comprising:
   a bracket including at least one component affixed thereto;
   a plurality of terminals affixed to the bracket and arranged for soldering to the printed circuit board, the plurality of terminals including at least a first terminal and a second terminal; and,
   the at least one component including at least a first lead coupled to the first terminal and a second lead coupled to the second terminal;
   the at least one component including a speaker.

5. The printed circuit board of claim 4, the plurality of terminals including a third terminal.

6. A printed circuit board comprising:
   a bracket including a speaker affixed thereto;
   a first terminal, a second terminal and a third terminal affixed to the bracket and arranged for soldering to the printed circuit board; and,
   the speaker having a first lead coupled to the first terminal and a second lead coupled to the second terminal.

7. A modem including a printed circuit board having an auto-insertable component, the auto-insertable component comprising:
   a bracket including at least one component affixed thereto;
   a plurality of terminals affixed to the bracket and arranged for soldering to the printed circuit board, the plurality of terminals including at least a first terminal and a second terminal; and,
   the at least one component including at least a first lead coupled to the first terminal and a second lead coupled to the second terminal,
   the at least one component including a speaker.

8. The modem of claim 7, the plurality of terminals including a third terminal.

9. A modem including a printed circuit board, the printed circuit board comprising:
   a bracket including a speaker affixed thereto;
   a first terminal, a second terminal and a third terminal affixed to the bracket and arranged for soldering to the printed circuit board; and,
   the speaker having a first lead coupled to the first terminal and a second lead coupled to the second terminal.

10. A speaker assembly comprising:

a bracket including a speaker affixed thereto, the bracket containing a plurality of holes;

a first terminal, a second terminal and a third terminal affixed to the bracket by mounting in the plurality of holes, each hole having no more than one terminal mounted therein, the first, second, and third terminals arranged for soldering to a printed circuit board; and, the speaker having a first lead coupled to the first terminal and a second lead coupled to the second terminal.

11. The speaker assembly of claim 10, the plurality of holes comprising a first hole, a second hole, a third hole, and a fourth hole, and where the first terminal is mounted in the first hole, the second terminal is mounted in the second hole, and the third terminal is mounted in either the third hole or the fourth hole.

12. A printed circuit board comprising:

a bracket including a speaker affixed thereto, the bracket containing a plurality of holes;

a first terminal, a second terminal and a third terminal affixed to the bracket by mounting in the plurality of holes, each hole having no more than one terminal mounted therein, the first, second, and third terminals arranged for soldering to the printed circuit board; and, the speaker having a first lead coupled to the first terminal and a second lead coupled to the second terminal.

13. The printed circuit board of claim 12, the plurality of holes comprising a first hole, a second hole, a third hole, and a fourth hole, and where the first terminal is mounted in the first hole, the second terminal is mounted in the second hole, and the third terminal is mounted in either the third hole or the fourth hole.

14. A modem including a printed circuit board, the printed circuit board comprising:

a bracket including a speaker affixed thereto, the bracket containing a plurality of holes;

a first terminal, a second terminal and a third terminal affixed to the bracket by mounting in the plurality of holes, each hole having no more than one terminal mounted therein, the first, second, and third terminals arranged for soldering to the printed circuit board; and, the speaker having a first lead coupled to the first terminal and a second lead coupled to the second terminal.

15. The modem of claim 14, the plurality of holes comprising a first hole, a second hole, a third hole, and a fourth hole, and where the first terminal is mounted in the first hole, the second terminal is mounted in the second hole, and the third terminal is mounted in either the third hole or the fourth hole.

16. In combination:

a bracket including a speaker affixed thereto, the bracket containing at least a first hole, a second hole, and a third hole;

a first terminal, a second terminal and a third terminal affixed to the bracket by mounting in the first hole, second hole, and third hole, respectively;

the first, second, and third terminals arranged for soldering to a printed circuit board; and, the speaker having a first lead coupled to the first terminal and a second lead coupled to the second terminal.

17. A printed circuit board comprising:

a bracket including a speaker affixed thereto, the bracket containing at least a first hole, a second hole, and a third hole;

a first terminal, a second terminal and a third terminal affixed to the bracket by mounting in the first hole, second hole, and third hole, respectively;

the first, second, and third terminals arranged for soldering to the printed circuit board; and, the speaker having a first lead coupled to the first terminal and a second lead coupled to the second terminal.

18. A modem including a printed circuit board, the printed circuit board comprising:

a bracket including a speaker affixed thereto, the bracket containing at least a first hole, a second hole, and a third hole;

a first terminal, a second terminal and a third terminal affixed to the bracket by mounting in the first hole, second hole, and third hole, respectively;

the first, second, and third terminals arranged for soldering to the printed circuit board; and, the speaker having a first lead coupled to the first terminal and a second lead coupled to the second terminal.

* * * * *